United States Patent [19]
Tarumi et al.

[11] 4,104,065
[45] Aug. 1, 1978

[54] PROCESS FOR PREPARATION OF PHOTOCONDUCTIVE POWDERS OF CADMIUM SULFIDE TYPE MATERIALS

[75] Inventors: Noriyoshi Tarumi, Tama; Akihiko Tamura; Masakazu Kokiso, both of Hachioji, all of Japan

[73] Assignee: Konishiroku Photo Industry Co., Ltd., Tokyo, Japan

[21] Appl. No.: 777,124

[22] Filed: Mar. 14, 1977

[30] Foreign Application Priority Data

Mar. 16, 1976 [JP] Japan .................................. 51-27686

[51] Int. Cl.$^2$ .............................................. G03G 5/04
[52] U.S. Cl. .................................... 96/1.5 R; 252/501
[58] Field of Search .......................... 96/1 S; 252/501

[56] References Cited
PUBLICATIONS

Bryant et al., British J. of Applied Phys., 1965, vol. 16, pp. 1065–1074.
Solid State Absts. 33, 992, 33993, p. 181, 1962.
Chemical Abstracts, vol. 63, col. 12481 c,d.

*Primary Examiner*—John D. Welsh
*Attorney, Agent, or Firm*—James E. Nilles

[57] ABSTRACT

A process for preparation of photoconductive powders of a cadmium sulfide type material comprising firing cadmium sulfide type material in an oxygen-containing atmosphere in the presence of a dispersant at a temperature at which the substance to be fired does not melt. The fired substance is water washed in order to remove the dispersant therefrom, if it is water soluble.

2 Claims, No Drawings

PROCESS FOR PREPARATION OF PHOTOCONDUCTIVE POWDERS OF CADMIUM SULFIDE TYPE MATERIALS

The present invention relates to a process for preparation of photoconductive powders of cadmium sulfide type material such as cadmium sulfide, cadmium selenide, cadmium sulfide selenide, zinc selenide, or the like.

In conventional process for preparation of photoconductive powder of cadmium sulfide type materials, a pure cadmium sulfide powder is mixed with an acceptor-forming activator such as copper or silver, a donor-forming coactivator such as halide, and a flux consisting of a halide such as cadmium chloride, sodium chloride or zinc chloride, and then the resulting mixture is fired at a temperature above the melting point of the flux to carry out the atomic valence control, whereby a photoconductive powder having various characteristics can be obtained. Various photoconductive materials are obtainable by adopting various mixing ratios of the mixture and firing temperatures. Namely photoconductive powder is fired twice at different temperatures.

In this conventional process, the crystal growth for obtaining fine crystal of cadmium sulfide, for example, is performed in the form of liquidus growth. The flux is added to make the temperature for this growth low.

In this conventional process, however, due to the use of a halide as a flux, the sulfur atom S of cadmium sulfide is inconveniently substituted by halogen atoms X of the flux, so that the resulted photoconductive powders come to have an unacceptably small dark resistance. Therefore, for substituting this halogen atoms X with a sulfur atom S again, it is necessary to effect a secondary firing within an atmosphere of, for example, hydrogen sulfide. Thus, in the conventional process, two stages of firing are disadvantageously required.

Another disadvantage of the conventional process is that the particle size of the resulted powders is unacceptable large, due to the fusing of the powder particles with each other during the firings. The larger particle size of the photoconductive material inconveniently deteriorates the workability during the preparation of an electrophotographic photosensitive material, image converter or image intensifier, resulting in a deteriorated flatness or smoothness of the surface of the photosensitive material to reduce the resolution of the image.

It is therefore an object of the invention to provide a process for preparation of photoconductive powders of cadmium sulfide type material, according to which a product of satisfactorily large dark resistance is obtained, without the secondary firing, i.e. with only one firing.

It is another object of the invention to provide a process for preparation of photoconductive powders of cadmium sulfide type material which ensures a small particle size of the product powder and, accordingly, an improved property of the photosensitive material.

To these ends, according to the invention, there is provided a process for preparation of photoconductive powders of cadmium sulfide type material comprising adding and mixing a dispersant to and with cadmium sulfide type material, without using a flux, firing the mixture in an atmosphere containing oxygen at a temperature lower than the melting point of the dispersant, and removing the dispersant as required.

More specifically, a donor material (coactivator) and an activator are added to the cadmium sulfide type material as required, and at least 20% by weight, preferably more than 50% by weight of a water soluble dispersant, with respect to the material is added to the material. An appropriate amount of dispersion medium is further added and mixed. The resultant mixture is then crushed by means of, for example, a ball mill.

The dispersant is expelled then by an evaporation in an evaporation dish.

The resultant is then fired at a temperature which would not cause the melting of the fired material, typically 400° to 800° C, within a quartz tube through which air is passed or within a crucible under an aerial atmosphere. After a sufficient water-washing, the dispersant, donor material or the activator are removed. Photoconductive powders of cadmium sulfide type material are obtained after a subsequent drying.

In the process as stated above, the crystals of the cadmium sulfide type material are formed by a gaseous-phase growth avoiding the fusing or melting during the firing, and then, the substitution of the sulfur atom with the halogen atoms does not take place, even when a halide is used as the dispersant. Therefore, the product comes to have practically and sufficiently large dark resistance, so that the secondary firing can be dispensed with. The elimination of the secondary firing also provides a satisfactorily small particle size of the powders.

Thus, according to the process of the present invention, the number of steps of process is reduced, since the secondary firing is dispensed with, to provide a facilitated production and a largely reduced cost of production.

At the same time, since the particle size is sufficiently small, a good workability is obtained during the manufacture of various photosensitive materials. The resultant photosensitive material exhibits, when it is used in, for example, electronic photography, a high initial potential, as well as a reduced dark attenuation, to ensure an improved resolution of the copy image. Although the theoretical mechanism for these advantageous effect is still unknown, the small particle size of the product powders is considered to be attributable to the following reasons.

The dispersant is effective to prevent the particles of the material from cohesion to disperse them in a state of separate unit particles. When the particles perform the crystal growth, the growth is enhanced by the particles of the dispersant in contact with the material particles to promote the growth in the gaseous phase at above a certain temperature. Since the growth is vapour phase growth, the growth speed is restrained sufficiently small, as compared with the case of the liquid phase growth, which renders the particle size sufficiently small.

For obtaining a good charging property, the vapour phase growth should be performed in the presence of oxygen. Thus, the product obtained by firing in a nitrogen-gas atmosphere would exhibit a small chargeability so that the initial potential becomes low, when it is charged.

This is attributable to the fact that the sulfur atom in the cadmium sulfide is substituted by a small amount of oxygen atom, during the firing. Since the oxygen exhibits a large electron attracting force to strongly trap the electron, the chargeability is enhanced correspondingly to provide a sufficiently high initial potential. Although the degree of crystal of the powders of the invention is smaller as compared with that of the crystal produced by liquid phase growth relying upon the flux, as will be seen from the foregoing description, this does not cause a substantial problem practically. The cadmium sulfide type material is used in the present invention may be commercially available materials for photoconductive powders, e.g. cadmium sulfide, cadmium selenide, cadmium sulfide selenide, zinc sulfide, zinc selenide or the like, and should have a purity of 99.999%.

A lower purity can be used, if it does not seriously effect the photoconductivity of the product. The purity of the material may be increased by refining.

The dispersant used in the process of the invention is the one which does not fuse or melt the cadmium sulfide type material and which per se is not molten at the firing temperature, and should be capable of dispersing the material particles almost into separate unit particles, by invading the cohered material particles, performing so-called partitioning effect.

To the contrary, ordinarily, the flux is an agent which itself is molten and causes the material to melt at the firing temperature. Therefore, the function of whether to cause the melting or not distinguishes the dispersant from the flux, at the firing temperature. In other words, the same agent acts as a dispersant when it is used at a temperature lower than its melting point, but acts as a flux when used at a temperature higher than the melting point.

The amount of the dispersant used in the process of the invention is more than 20% by weight, preferably more than 50%, with respect to the cadmium sulfide type material. The more dispersant is used, the smaller particle size of photoconductive powder is obtained.

Preferably, the dispersant is of a high purity, chemically inactive to and by the material, and water soluble for an easier washing remove which is usually taken, and should have high melting point.

The dispersant advantageously used in the process of the invention may be, for example, sodium chloride, potassium chloride, anhydride of magnesium chloride, anhydride of cadmium chloride, anhydride of cobalt chloride, barium chloride, sodium bromide, potassium bromide, anhydride of cadmium bromide, anhydride of cobalt bromide, sodium iodide, potassium iodide, barium iodide, potassium carbonate or the like. For the dispersion medium applied before the firing, an organic solvent or water is used. The organic solvent should be volatile and compatible with water. Typical solvent is, for example, a lower alcohol of various types or acetone.

The donor material which may be used in the process of the invention is an activating agent such as ammonium chloride or a trivalent metal such as aluminum gallium or indium, capable of forming donor level within the crystal of the cadmium sulfide type material.

The donor material is used at a rate of $10^{-2}$ mol % or lower, in relation with the material.

The activator which may be used in the process of the invention is an activating agent for forming an acceptor level within the crystal of the material, and is typically a halide of gold, silver or copper, or a nitrate or sulfate thereof. The activator is added usually at a rate of $10^{-2}$ mol % or less, with respect to the material.

The present invention is further explained with the following examples.

Samples 1 to 6 of the photoconductive powders of the invention were prepared in accordance with the prescription as listed in the Table 1. Namely, $10^{-4}$ mol % of cupric chloride was added as the activator to each 50 g of a cadmium sulfide type material of high purity having a mean particle size of 0.1 $\mu$, and then, different dispersants were added at different rates to the respective materials. After an addition of adequate amount of dispersion medium, crushings were performed in respective ball mill made of agate, for 6 hours, to obtain 6 mixtures. Each of the mixtures was then heated and dried at 140° C for 10 hours, within a crucible of heat-resistant alumina ceramic, and was then subjected to firing within an electric oven under aerial atmosphere for 60 minutes. Each fired mixture was then cooled down to the room temperature, and was then water washed by 20 times by means of inclined method. After having confirmed no detection of ion resulted by the dispersant in the washing, the mixtures were dried to obtain photoconductive powders.

For informations, NaCl, $Na_2SO_4$ and $CdSO_4$ have respective melting points of 804° C, 800° C and 1000° C.

For the purpose of comparison, samples 7 to 12 were prepared in accordance with the corresponding procedures with the samples 1 to 6, respectively, excepting that 10 g of $CdCl_2.5/2\ H_2O$ having a melting point of 568° C as a flux, was further added to each corresponding mixtures. Each mixture was molten in the firing process.

In the Table 2 showing the particle size distribution of the samples 1 to 12, numerals represent the number of particles from 100 particles belonging to respective range of particle sizes.

Table 1

| | Sample No. | 1 | 2 | 3 | 4 | 5 | 6 |
|---|---|---|---|---|---|---|---|
| Material | Substances | CdS | CdS | CdS | CdS | CdS | CdSSe |
| | Quantities (g) | 50 | 50 | 50 | 50 | 50 | 50 |
| Activator | Substances | $CuCl_2$ | $CuCl_2$ | $CuCl_2$ | $CuCl_2$ | $CuCl_2$ | $CuCl_2$ |
| | Quantities (mol %) | $10^{-4}$ | $10^{-4}$ | $10^{-4}$ | $10^{-4}$ | $10^{-4}$ | $10^{-4}$ |
| Dispersant | Substances | NaCl | NaCl | NaCl | $Na_2SO_4$ | $CdSO_4$ | NaCl |
| | Quantities (mol %) | 150 | 250 | 500 | 250 | 250 | 250 |
| Medium Disp- | Substances | $H_2O$ | $H_2O$ | $H_2O$ | $CH_3OH$ | $CH_3OH$ | $H_2O$ |
| | Quantities (ml) | 70 | 80 | 150 | 100 | 100 | 100 |
| Firing | Temperature (° C) | 580 | 580 | 580 | 580 | 580 | 700 |
| | Time (min.) | 60 | 60 | 60 | 60 | 60 | 60 |

Table 2

| Particle Size ($\mu$) | Sample No. | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| up to 0.5 | 30 | 52 | 63 | 32 | 31 | 22 | 4 | 16 | 28 | 3 | 1 | 3 |
| 0.5 to 1 | 50 | 44 | 36 | 51 | 50 | 48 | 34 | 42 | 56 | 35 | 37 | 28 |
| 1 to 2 | 12 | 4 | 1 | 15 | 17 | 21 | 40 | 38 | 16 | 50 | 53 | 55 |
| 2 to 5 | 8 | — | — | 2 | 2 | 9 | 18 | 4 | — | 8 | 9 | 10 |
| 5 to 10 | — | — | — | — | — | — | 4 | — | — | 3 | 2 | 4 |

It is clearly observed in the Table 2 that the samples 1 to 6 produced by the process of the invention have smaller particle sizes than the corresponding samples 7 to 12.

Twelve photosensitive materials were prepared by at first preparing twelve photosensitive liquids by ultrasonic dispersion on mixtures of 12 g of respective samples 1 to 12, 7 g of alkyd resin and 7 ml of butyl acetate. The liquids were then applied onto aluminum plates having a thickness of 200 μ, by means of a wire bar coater, to form layers of 20 μ in thickness after drying, and then heat treated at 130° C for one hour, respectively.

The photosensitive materials 1 to 12 corresponding respectively to samples 1 to 12 were then tested by a rotary electrometer for measuring the charged electric potential, the results of which are shown in the Table 3.

Table 3

| Photosensitive materials | 1 | 2 | 3 | 4 | 5 | 6 | 7 | 8 | 9 | 10 | 11 | 12 |
|---|---|---|---|---|---|---|---|---|---|---|---|---|
| Potential (V) | 250 | 530 | 575 | 300 | 315 | 280 | 150 | 213 | 234 | 141 | 132 | 115 |

As will be seen from Table 3, while the photosensitive materials each having a layer containing the cadmium sulfide powder produced by conventional method employing only once firing exhibit impractically low chargeabilities, the materials each having a layer comprising the photoconductive powders prepared by the invention provide satisfactory chargeabilities.

Further, when these photosensitive materials were used to form electrophotographies with a repeated type electrophotographic copying machine, images of acceptable density were obtained by using the materials in accordance with the invention, although the image according to the photosensitive material 1 had a somewhat low density, while, in contrast to the above, the photosensitive materials 7 to 12 exhibited too small density which cannot be referred to as "images".

In addition, the dark resistance and the photoconductivity of the photoconductive powders of the invention are advantageously large.

It will be understood from the foregoing description that, according to the invention, only one firing performed in an aerial atmosphere ensures a reduced number of steps of the process, and considerably facilitates the production of the photoconductive powders. The resultant reduced cost of production and the reduced particle size, as well as other improved properties in combination promises a great advantage.

What is claimed is:

1. A process for preparing photoconductive powders having improved photosensitive properties which consists of forming a mixture of a powdered photoconductive material selected from the group consisting of cadmium sulfide, cadmium selenide, cadmium sulfide selenide, and zinc oxide with an effective amount of a donor material and an activator, adding to the resulting mixture at least about 20% by weight of the photoconductive material of a water soluble dispersant selected from the group consisting of sodium chloride, sodium sulfate, cadmium sulfate, potassium chloride, anhydride of magnesium chloride, anhydride of cadmium chloride, anhydride of cobalt chloride, barium chloride, sodium bromide, potassium bromide, anhydride of cadmium bromide, anhydride of cobalt bromide, sodium iodide, potassium iodide, barium iodide and potassium carbonate, then firing the mixture in the presence of oxygen at a temperature selected from about 400° to about 800° C. at which temperature the dispersant does not melt and finally removing the dispersant to obtain a finely divided photoconductive powder.

2. The process of claim 1 in which the addition of the water soluble dispersant is accompanied by the addition of a dispersing media selected from water and lower alcohols and the resulting mixture is ground and the dispersing media removed before the firing.

* * * * *